(12) United States Patent
Li et al.

(10) Patent No.: US 10,011,898 B2
(45) Date of Patent: Jul. 3, 2018

(54) CRUCIBLE DEVICE

(71) Applicant: BOE Technology Group Co., Ltd., Beijing (CN)

(72) Inventors: Xiaohu Li, Beijing (CN); Zhongyuan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/309,061

(22) PCT Filed: Jan. 29, 2016

(86) PCT No.: PCT/CN2016/072705
§ 371 (c)(1),
(2) Date: Nov. 4, 2016

(87) PCT Pub. No.: WO2017/012330
PCT Pub. Date: Jan. 26, 2017

(65) Prior Publication Data
US 2017/0159166 A1 Jun. 8, 2017

(30) Foreign Application Priority Data

Jul. 23, 2015 (CN) .......................... 2015 1 0438850

(51) Int. Cl.
*C23C 14/24* (2006.01)
*C23C 14/20* (2006.01)
*H01L 51/56* (2006.01)

(52) U.S. Cl.
CPC ............ *C23C 14/243* (2013.01); *C23C 14/20* (2013.01); *H01L 51/56* (2013.01)

(58) Field of Classification Search
CPC ..................................... C23C 14/243–14/325
See application file for complete search history.

(56) References Cited

U.S. PATENT DOCUMENTS 3,446,422 A * 5/1969 Bailleul-Langlais .... B01J 3/006
417/199.1
4,587,134 A * 5/1986 Shimozato .............. C23C 14/24
118/665

(Continued)

FOREIGN PATENT DOCUMENTS

CN 103695847 A 4/2014
CN 104988462 A 10/2015

(Continued)

OTHER PUBLICATIONS

English translation of JP 2007-77458.*
May 3, 2016—International Search Report and Written Opinion Appn PCT/CN2016/072705 with Eng Tran.

*Primary Examiner* — Aiden Lee
(74) *Attorney, Agent, or Firm* — Banner & Witcoff, Ltd.

(57) ABSTRACT

A crucible device comprises a crucible body configured to store evaporation material, with an opening disposed therein; a crucible cover which matches the opening of the crucible body and which forms a hermetic space in cooperation with the crucible body when being in a closed state and opens the opening of the crucible body when being in an open state; a driving mechanism comprising a housing with a cavity therein and a piston disposed within the cavity, the cavity being divided by the piston into a closed chamber and an open chamber by the piston, the open chamber being in communication with outside of the cavity through a cavity opening of the cavity, the closed chamber storing gas therein, the piston being connected with the crucible cover by a transmission mechanism, the piston being moved within the cavity in accordance with change of pressure in the open chamber, thereby driving the crucible cover to switch between the open state and the closed state.

20 Claims, 5 Drawing Sheets

(56) References Cited

U.S. PATENT DOCUMENTS

| | | | | |
|---|---|---|---|---|
| 4,850,806 A | * | 7/1989 | Morgan | F04B 37/14 |
| | | | | 417/205 |
| 4,895,592 A | | 1/1990 | Hatwar et al. | |
| 5,363,872 A | * | 11/1994 | Lorimer | F16K 1/10 |
| | | | | 137/1 |
| 5,678,595 A | * | 10/1997 | Iwabuchi | F16K 49/002 |
| | | | | 137/341 |
| 5,705,226 A | * | 1/1998 | Fukui | C23C 14/243 |
| | | | | 427/250 |
| 8,061,297 B2 | * | 11/2011 | Albertalli | B41J 2/15 |
| | | | | 101/486 |
| 2002/0092144 A1 | * | 7/2002 | Nguyen | C23C 16/44 |
| | | | | 29/25.01 |
| 2003/0003016 A1 | | 1/2003 | Las Navas Garcia | |
| 2003/0131792 A1 | * | 7/2003 | Park | C23C 16/45557 |
| | | | | 118/712 |
| 2006/0093754 A1 | * | 5/2006 | Krueger | C23C 14/48 |
| | | | | 427/523 |
| 2009/0114157 A1 | * | 5/2009 | Lee | C23C 16/4482 |
| | | | | 118/726 |
| 2009/0250000 A1 | * | 10/2009 | Kobayashi | H01L 21/67201 |
| | | | | 118/50 |
| 2010/0322604 A1 | * | 12/2010 | Fondurulia | C23C 16/4481 |
| | | | | 392/451 |
| 2011/0253034 A1 | * | 10/2011 | Iwata | C30B 9/10 |
| | | | | 117/84 |

FOREIGN PATENT DOCUMENTS

| | | |
|---|---|---|
| JP | 2007077458 A | 3/2007 |
| TW | 201202454 A | 1/2012 |

* cited by examiner

CRUCIBLE DEVICE

The application is a U.S. National Phase Entry of International Application No. PCT/CN2016/072705 filed on Jan. 29, 2016, designating the United States of America and claiming priority to Chinese Patent Application No. 201510438850.4 filed on Jul. 23, 2015. The present application claims priority to and the benefit of the above-identified applications and the above-identified applications are incorporated by reference herein in their entirety.

TECHNICAL FIELD

Embodiments of the present disclosure relate to a crucible device.

BACKGROUND

At present, during manufacturing a bottom emission type OLED, preparation of display components needs to be done in a vacuum evaporation equipment in which a crucible is used to hold materials to be evaporated which contains easily oxidizable active metal materials.

When a vacuum state is not achieved in the vacuum evaporation chamber, the easily oxidizable active metal materials in the crucible will be oxidized, which will affect the performance of the display components. To reduce oxidation of the easily oxidizable active metal materials, a crucible cover is added to the crucible in the practical production. When the crucible cover is engaged with the crucible body, the crucible cover along with the crucible body form a hermetic space, so that the easily oxidizable active metal materials placed in the crucible is isolated from ambient air. When the evaporation material is required to be evaporated in a state in which the crucible device is in the vacuum evaporation chamber, the crucible cover needs to be removed so that the evaporation material is evaporated out of the crucible body so as to carry out the evaporation. During evaporation of an active metal, typically, a crucible holding the active metal is put into the evaporation chamber, the crucible cover is opened, the evaporation chamber is closed, and then air is quickly evacuated to reach a high vacuum state, thereby reducing the oxidation of the metal. However, in the practical operation, it still occurs that many metals are oxidized which affects the performance of the components.

Therefore, how to achieve automatic opening and closing of the crucible cover of the crucible device becomes one of the technical problems to be solved by those skilled in the art.

SUMMARY

At least one embodiment of the present disclosure provides a crucible device which is capable of automatically switch a crucible cover to open or to close according to gas pressure of ambient circumstance of the crucible device.

At least one embodiment of the present disclosure provides a crucible device comprising a crucible body configured to store evaporation material, an opening being disposed on the crucible body;

a crucible cover which matches the opening of the crucible body and which forms a hermetic space in cooperation with the crucible body when being in a closed state and opens the opening of the crucible body when being in an open state;

a driving mechanism comprising a housing with a cavity therein and a piston disposed within the cavity, the cavity being divided by the piston into a closed chamber and an open chamber, the open chamber being in communication with outside of the chamber body through a cavity opening of the cavity, the closed chamber storing gas therein, the piston being connected with the crucible cover by a transmission mechanism, the piston being moved within the cavity in accordance with change of pressure in the open chamber, thereby driving the crucible cover to switch between the open state and the closed state.

In one embodiment of the present disclosure, the crucible body comprises a container provided with an opening end and a fixed block disposed at the opening end of the container and detachably fixed on the container, a through hole being provided in the fixed block so as to form an opening of the crucible body, a surface of the fixed block facing toward the side of the crucible cover being a bearing face of the crucible cover, the driving mechanism being mounted on the fixed block and being configured to drive the crucible cover to slide on the bearing face so that the crucible cover is switched between the open state and the closed state.

In one embodiment of the present disclosure, the container is fixedly connected to the fixed block by threads.

In one embodiment of the present disclosure, the transmission mechanism is a link mechanism.

In one embodiment of the present disclosure, the link mechanism comprises an actuating lever and a driving rod, wherein the driving rod is mounted to the fixed block by a stationary shaft, a first end of the driving rod is connected with the crucible cover by transmission, the stationary shaft is perpendicular to the bearing face of the fixed block;

moving direction of the piston being perpendicular to the stationary shaft;

a first end of the actuating lever is connected with the piston by transmission, and a second end of the actuating lever is pivotably connected with a second end of the driving rod by a pivot shaft, the actuating lever is configured to drive the driving rod to rotate about the stationary shaft when in operation.

In one embodiment of the present disclosure, the crucible cover is slidable with respect to the fixed block by a sliding fit of at least one sliding slot and at least one sliding rail.

In one embodiment of the present disclosure, wherein when the crucible cover is in the closed state, a gas pressure in the closed chamber is one atmosphere.

In one embodiment of the present disclosure, wherein the at least one sliding slot is disposed on the fixed block, and the at least one sliding rail is the pivot shaft pivotably connecting the actuating lever with the driving rod.

In one embodiment of the present disclosure, the crucible cover is made of a metallic material, and the fixed block is made of titanium.

In one embodiment of the present disclosure, wherein the crucible cover is of circular shape, and a movement track of the crucible cover formed by the actuation of the driving rod has a travel distance larger than a diameter of the crucible cover.

In operation, the when the crucible device is put into the vacuum evaporation chamber and the vacuum evaporation chamber is not evacuated, there is no change in gas pressure in an environment where the crucible device is positioned. The crucible cover is in the closed state, and the crucible cover and the crucible body cooperate to form a hermetic space, so as to reduce oxidization degree of the easily oxidizable metal material held within the crucible body and thus the influence on the performance of display components. When the vacuum evaporation chamber is evacuated, the gas pressure in the vacuum evaporation chamber is gradually reduced. At this time, the gas pressure in the open chamber formed by the cavity in the housing of the driving device is gradually reduced. The piston is moved toward the side of the open chamber by an impulse of the gas pressure in the closed chamber, thereby actuating the transmission mechanism to move the crucible cover connected therewith so as to make the crucible cover begin a switch from the closed state to the open state until the crucible cover is switched to the open state. At this time, the crucible body is heated and the evaporation material within the crucible body is evaporated out of the crucible device, thereby performing the evaporation.

Therefore, the driving mechanism configured to drive the crucible cover of the crucible device can make the crucible cover which matches with the crucible body capable of being switched between the open state and the closed state according to different gas pressures in the environment where the crucible device. Thus, the crucible device can achieve an automatic opening and closing of the crucible cover by use of the environmental pressure outside the crucible device.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
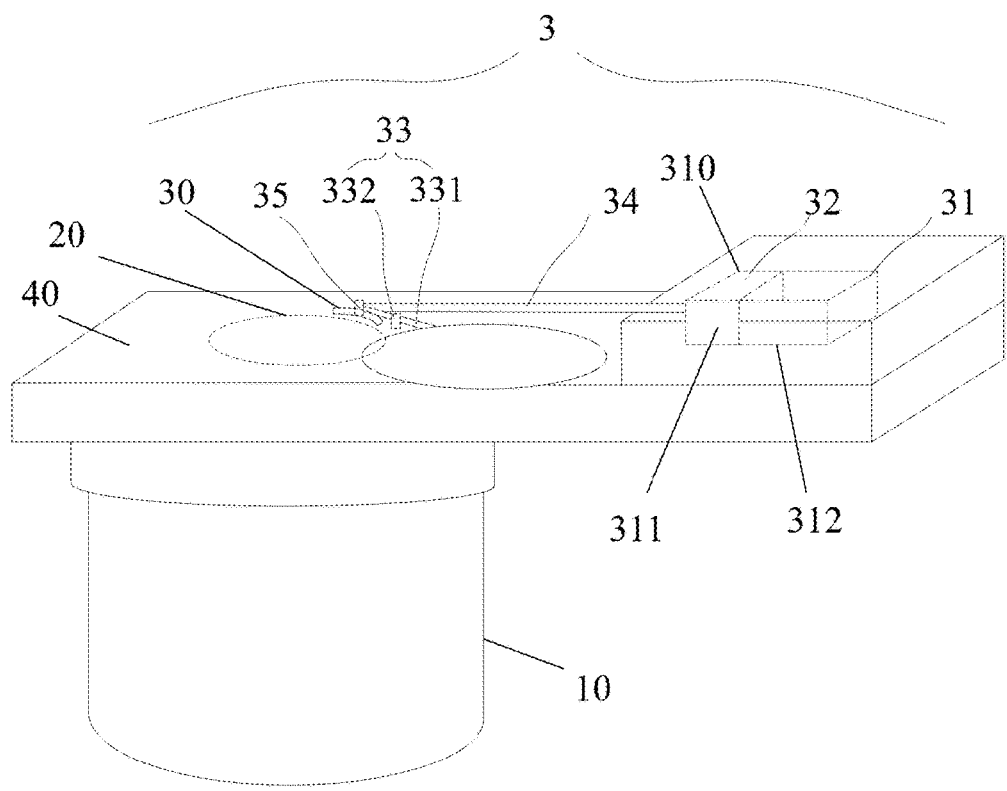
FIG. 1 is an illustrative structural view of the crucible device in an open state according to one embodiment of the present disclosure.
Figure 2:
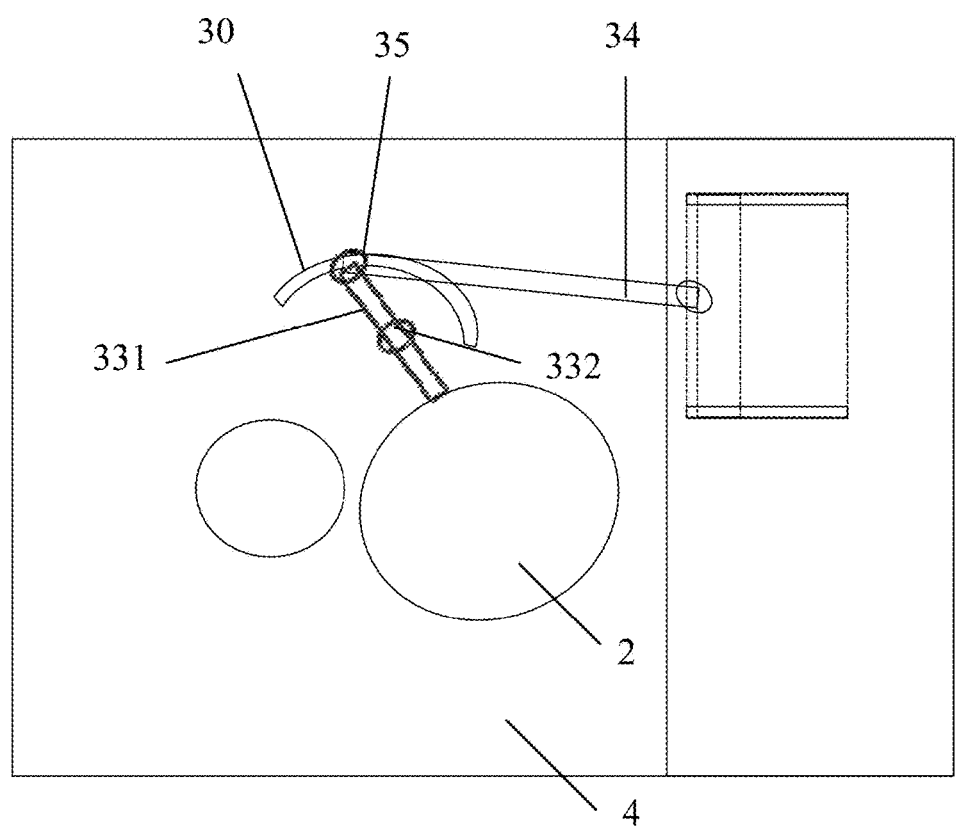
FIG. 2 is a top view of the crucible device in an open state according to one embodiment of the present disclosure.
Figure 3:
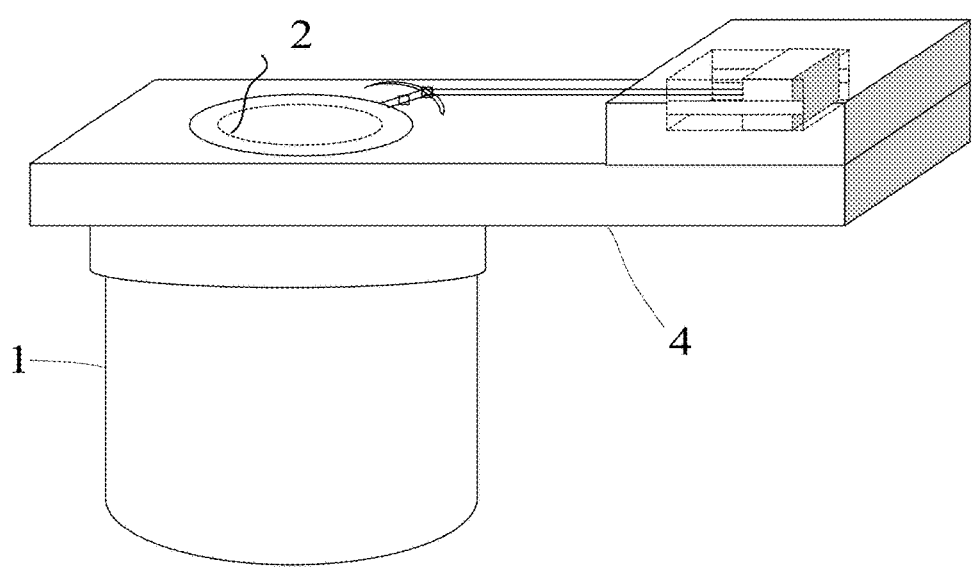
FIG. 3 is an illustrative structural view of the crucible device in a closed state according to one embodiment of the present disclosure.
Figure 4:
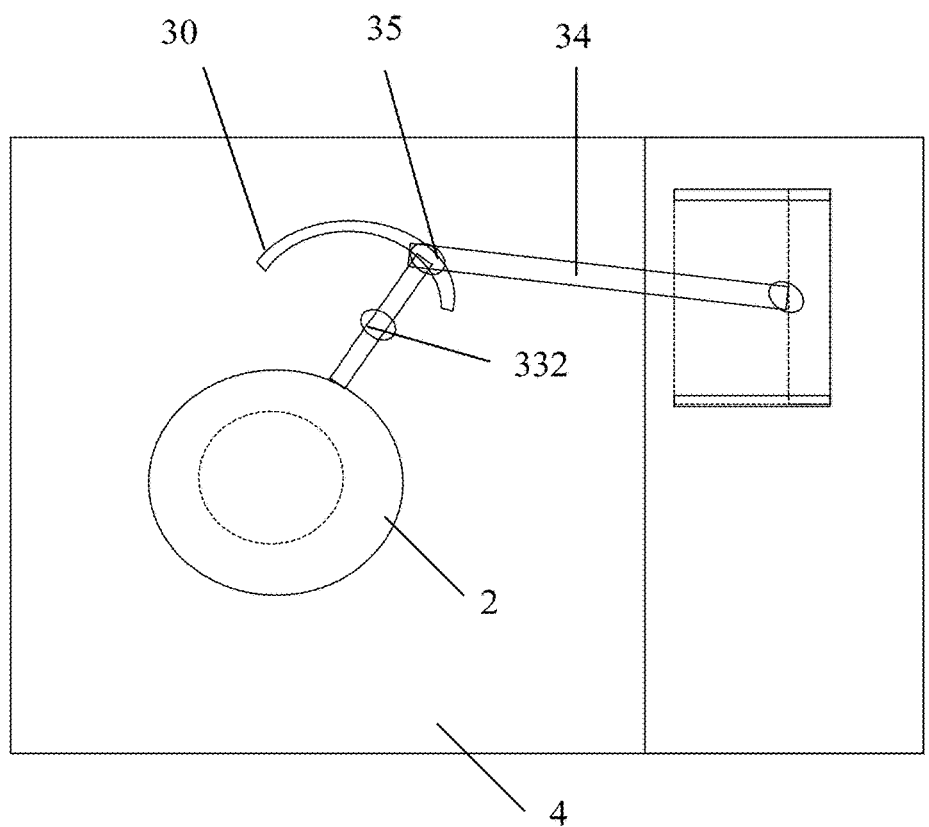
FIG. 4 is an illustrative structural view of the crucible device in a closed state according to one embodiment of the present disclosure.
Figure 5:
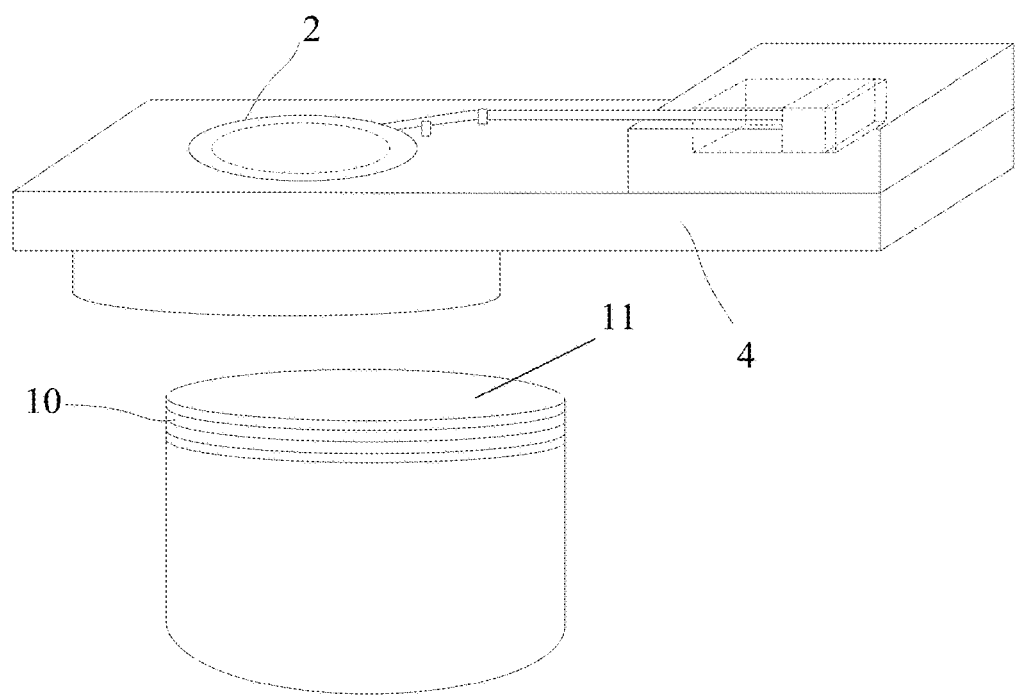
FIG. 5 is an illustrative structural view of the crucible body of the crucible device according to one embodiment of the present disclosure.

As illustrated in FIG. 1 to FIG. 4, one of the embodiments of the present disclosure provides a crucible device. FIG. 1 and FIG. 2 are an illustrative structural view and a top view of the crucible device in an open state respectively. FIG. 3 and FIG. 4 are an illustrative structural view and a top view of the crucible device in a closed state respectively. The crucible device comprises a crucible body 1 for holding evaporation material in which an opening is disposed;

a crucible cover 2 which matches the opening of the crucible body 1 and which forms a hermetic space in cooperation with the crucible body 1 when the crucible cover 2 being in a closed state and opens the opening of the crucible body 1 when the crucible cover 2 being in an open state;

a driving mechanism 3 comprising a housing with a cavity 31 therein and a piston 32 disposed within the cavity 31, the cavity 31 having a cavity opening 310 and being divided into a closed chamber 312 and an open chamber 311 by the piston 32, the open chamber 311 being in communication with outside of the chamber body through the cavity opening 310, the closed chamber 312 storing gas therein, the piston 32 being connected with the crucible cover 2 through a transmission mechanism 33 so that the piston 32 can be moved within the cavity in accordance with change of pressure in the open chamber 311, thereby driving the crucible cover 2 to switch between the open state and the closed state.

In the above-described crucible device, when the crucible device is put into the vacuum evaporation chamber and the vacuum evaporation chamber is not evacuated, there is no change in gas pressure in an environment where the crucible device is positioned. The crucible cover 2 is in the closed state, and the crucible cover 2 and the crucible body 1 cooperate to form a hermetic space, so as to reduce oxidization degree of the easily oxidizable metal material held within the crucible body 1 and thus the influence on the performance of display components. When the vacuum evaporation chamber is evacuated, the gas pressure in the vacuum evaporation chamber is gradually reduced. At this time, the gas pressure in the open chamber 311 formed by the cavity 31 in the housing of the driving device is gradually reduced. The piston 32 is moved toward the side of the open chamber 311 by an impulse of the gas pressure in the closed chamber 312, thereby actuating the transmission mechanism 33 to move the crucible cover 2 connected therewith so as to make the crucible cover 2 begin a switch from the closed state to the open state until the crucible cover 2 is switched to the open state. At this time, the crucible body 1 is heated and the evaporation material within the crucible body 1 is evaporated out of the crucible device, thereby performing the evaporation.

Therefore, the driving mechanism 3 for driving the crucible cover 2 of the above-described crucible device can make the crucible cover 2 be in different positions in accordance with different gas pressures in the environment where the crucible device is located, so as to make the crucible cover 2 which cooperates with the crucible body 1 be capable of switching between the open state and the closed state by the driving of the driving mechanism 3 in various pressure conditions. Thus, the crucible device can achieve an automatic opening and closing of the crucible cover 2 by use of the environmental pressure outside the crucible device.

In one embodiment of the present disclosure, as illustrated in FIG. 1 to FIG. 5, the crucible body 1 comprises a container 10 for receiving evaporation material. A fixed block 4 is detachably fixed at an opening end 11 of the container so as to facilitate feeding evaporation material to the crucible body 1. A through hole is provided in the fixed block 4 so as to form an opening 20 of the crucible body 1 which matches the crucible cover 2. When the crucible cover 2 and the crucible body 1 are engaged with each other, the crucible body 1, the fixed block 4 and the crucible cover 2 can form a hermetic space, which reduces oxidization degree of the easily oxidizable metal material held within the crucible and thus reduces the influence on the performance of display components. The surface 40 of the fixed block 4 facing toward the crucible cover 2 is a bearing face for the crucible cover 2. The driving mechanism 3 is mounted on the fixed block 4 and the fixed block 4 supports the driving mechanism 3. At the same time, in the operation, the driving mechanism 3 drives the crucible cover 2 to slide on the bearing face so that the crucible cover 2 is switched between the open state and the closed state, thereby meeting the requirement of opening and closing the opening 20 of the crucible body 1.

For example, the fixed block 4 is mounted on the opening end 11 of the container 10 by a threaded connection and thus is detachably fixed on the container 10. When feeding evaporation material, the container is detached from the fixed block 4 and then is connected to the fixed block 4 after the evaporation material is added. The detachably-fixed connection between the fixed block 4 and the container allows convenient feeding evaporation material into the crucible body 1.

In one embodiment of the present disclosure, as illustrated in FIG. 1 to FIG. 5, the transmission mechanism 33 is a link mechanism which is connected with the crucible cover 2 and drives the crucible cover 2. The piston 32 of the driving mechanism 3 is connected with the crucible cover 2 through the link mechanism. The driving mechanism 3 drives the crucible cover 2 to slide on the bearing face of the fixed block 4 which bears the crucible cover 2, so as to make the crucible cover 2 switch between the open state and the closed state.

For example, as illustrated in FIG. 1 to FIG. 4, the link mechanism comprises an actuating lever 34 and a driving rod 331. The driving rod 331 is mounted to the fixed block 4 by a stationary shaft 332 in the middle of the driving rod 331. A first end of the driving rod 331 is connected with the actuating lever 34 by a pivot shaft 35. A first end of the actuating lever 34 is connected with the piston 32 by transmission, and a second end of the actuating lever 34 is connected with a second end of the driving rod 331 by transmission. The movement of the piston 32 drives the actuating lever 34 to rotate the pivot shaft 35 which drives the driving rod 331 to rotate about the stationary shaft 332, thereby actuating the crucible cover 2 so that the crucible cover 2 is switched between the open state and the closed state. The axis of the stationary shaft 332 is perpendicular to the bearing face of the fixed block 4 so as to ensure that the driving rod 331 drives the crucible cover 2 to move on the bearing face of the fixed block 4 which bears the crucible cover 2.

In one embodiment of the present disclosure, there is a sliding fit between the crucible cover 2 and the fixed block 4 by at least one pair of sliding slot and sliding rail which are in sliding fit, so that the crucible cover 2 can be slid on the fixed block 4 by the driving mechanism 3 and thus the crucible cover 2 can be switched between the open state and the closed state.

As illustrated in FIG. 1 to FIG. 4, the at least one sliding slot 30 is formed on the fixed block 4. At least one sliding rail is the pivot shaft 35 pivotably connecting the actuating lever 34 and the driving rod 331. The pivot shaft 35 is received in the sliding slot 30. When the piston 32 is moved in the cavity, the pivot shaft 35 is driven to slide in the sliding slot 30 and thus drives the driving rod 331 to rotate about the stationary shaft 332, thereby making the crucible cover 2 slide on the fixed block 4 and switch between the open state and the closed state.

In one embodiment of the present disclosure, as illustrated in FIG. 3 and FIG. 4, when the crucible cover is in the closed state, the gas pressure in the closed chamber 312 is set to be one atmosphere pressure. Therefore, when the external environment is at one atmosphere pressure, since the inside and the outside of the closed chamber 312 have the same pressure, the crucible cover 2 is in the closed state. When the external environment is lower than one atmosphere pressure (almost vacuum state), due to the pressure difference between the inside and the outside of the closed chamber 312, the piston 32 is moved toward the side of the open chamber 311 by the impulse of the gas pressure in the closed chamber 312, thereby actuating the actuating lever 34 connected therewith to drive the driving rod 331, which is connected with the actuating lever 34, to rotate about the pivot shaft 332, which actuates the crucible cover 2 connected with the driving rod 331 so that the crucible cover 2 is opened, as illustrated in FIG. 1 and FIG. 2.

In one embodiment of the present disclosure, the crucible cover 2 can be made of metallic materials such as iron, or can be made of non-metallic materials such as graphite. The fixed block 4 is made of titanium. Taking an example of the crucible cover 2 made of iron, a force analysis of the crucible cover 2 under the compressed gas is as follows.

density of iron ρ: 7.9 g/cm$^3$ (density of titanium: 4.54 g/cm$^3$)
friction coefficient between metals μ: dynamic (static) friction without lubricant 0.15
volume of slider: 0.5 cm×1 cm×0.5 cm
force required to urge the slider to slide:

$$F_1 = \rho v g \mu$$
$$= 7.9 \text{ g/cm}^3 \times 0.5 \text{ cm} \times 1 \text{ cm} \times 0.5 \text{ cm } \times 10 \text{N/kg} \times 0.15$$
$$= 2.9625 \times 10^{-3} \text{N}$$

The gas pressure is calculated as follows.
volume of the gas chamber: 3 cm×3 cm×1 cm=9 cm$^3$
volume of the slider chamber: 0.5 cm×1 cm×2 cm=1 cm$^3$ (can be ignored comparing with the size of the gas chamber)
the gas pressure is $F_2$=PS=101×1000 Pa×1 cm×0.5 cm=5.05N It can be seen from the above data that the gas pressure is much greater than the frictional force and the piston can push the crucible cover open.

In one embodiment of the present disclosure, the crucible cover 2 is of circular shape. The movement track of the crucible cover 2 formed by the actuation of the driving rod 331 has a radius larger than the diameter of the crucible cover 2. When there is a pressure difference between the inside and the outside of the closed chamber 312, the gas within the closed chamber 312 urges the piston 32 to actuate the actuating lever 34 connected therewith and drives the pivot shaft 35 to rotate and thus actuates the driving rod 331 connected with the actuating lever 34 through the pivot shaft 35. The driving rod 331 is thus moved about the stationary shaft 332 and actuates the crucible cover 2 connected with the driving rod 331. The sliding slot on the crucible cover 2 slides with respect to the sliding rail on the fixed block 4, so that the crucible cover 2 is opened. Refer to FIG. 4 and FIG. 2 in combination, which respectively illustrates a closed state of the crucible cover 2 and an open state of the crucible cover 2. As illustrated, the crucible cover 2 has a diameter of D. As illustrated in FIG. 4, which schematically illustrates a closed state of the crucible cover 2, the center of the crucible cover 2 is located at point O. And as shown in FIG. 2, which schematically illustrates an open state of the crucible cover 2, the center of the crucible cover 2 is located at point O'. Since the movement track of the crucible cover 2 formed by the actuation of the driving rod 331, i.e., the travel distance of OO', is larger than the diameter of the crucible cover 2, the crucible cover 2 is completely moved away from the opening of the crucible body so that the opening of the crucible body is entirely open. Thus, the opening of the crucible body does not block the gaseous substance formed by the evaporation of the evaporation material within the crucible body and the evaporation material is not inclined to be accumulated at the opening of the crucible body which has little influence on evaporation process.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510438850.4 filed on Jul. 23, 2015, the disclosure of which is hereby entirely incorporated by reference.

The invention claimed is:

1. A crucible device comprising:
a crucible body configured to store evaporation material, an opening being disposed on the crucible body;
a crucible cover which matches the opening of the crucible body and which forms a hermetic space in cooperation with the crucible body when being in a closed state and opens the opening of the crucible body when being in an open state; and
a driving mechanism comprising a housing with a cavity therein and a piston disposed within the cavity, the cavity being divided by the piston into a closed chamber and an open chamber, the open chamber being in communication with outside of the chamber body through a cavity opening of the cavity, the closed chamber storing a constant amount of gas therein, the piston being connected with the crucible cover by a transmission mechanism, the piston being moved within the cavity in accordance with a change of pressure in the open chamber, while maintaining the constant amount of the gas in the closed chamber, thereby driving the crucible cover to switch between the open state and the closed state.

2. The crucible device according to claim 1, wherein the crucible body comprises a container provided with an opening end and a fixed block disposed at the opening end of the container and detachably fixed on the container, a through hole being provided in the fixed block so as to form the opening of the crucible body, a surface of the fixed block facing toward a side of the crucible cover being a bearing face of the crucible cover, the driving mechanism being mounted on the fixed block and being configured to drive the crucible cover to slide on the bearing face so that the crucible cover is switched between the open state and the closed state.

3. The crucible device according to claim 2, wherein the container is fixedly connected to the fixed block by threads.

4. The crucible device according to claim 1, wherein the transmission mechanism is a link mechanism.

5. The crucible device according to claim 4, wherein the link mechanism comprises an actuating lever and a driving rod, wherein
the driving rod is mounted to a fixed block by a stationary shaft, a first end of the driving rod is connected with the crucible cover by transmission, the stationary shaft is perpendicular to a bearing face of the fixed block; and
a first end of the actuating lever is connected with the piston by transmission, and a second end of the actuating lever is pivotably connected with a second end of the driving rod by a pivot shaft, the actuating lever is configured to drive the driving rod to rotate about the stationary shaft.

6. The crucible device according to claim 2, wherein the crucible cover is slidable with respect to the fixed block by a sliding fit of at least one sliding slot and at least one sliding rail.

7. The crucible device according to claim 1, wherein when the crucible cover is in the closed state, a gas pressure in the closed chamber is one atmosphere.

8. The crucible device according to claim 6, wherein the at least one sliding slot is disposed on the fixed block, and the at least one sliding rail is a pivot shaft.

9. The crucible device according to claim 2, wherein the crucible cover is made of metallic materials, and the fixed block is made of titanium.

10. The crucible device according to claim 1, wherein the crucible cover is of a circular shape, and a movement track of the crucible cover formed by actuation of a driving rod has a travel distance larger than a diameter of the crucible cover.

11. The crucible device according to claim 2, wherein the transmission mechanism is a link mechanism.

12. The crucible device according to claim 11, wherein the link mechanism comprises an actuating lever and a driving rod, wherein
the driving rod is mounted to the fixed block by a stationary shaft, a first end of the driving rod is connected with the crucible cover by transmission, the stationary shaft is perpendicular to the bearing face of the fixed block; and
a first end of the actuating lever is connected with the piston by transmission, and a second end of the actuating lever is pivotably connected with a second end of the driving rod by a pivot shaft, the actuating lever is configured to drive the driving rod to rotate about the stationary shaft.

13. The crucible device according to claim 3, wherein the transmission mechanism is a link mechanism.

14. The crucible device according to claim 13, wherein the link mechanism comprises an actuating lever and a driving rod, wherein
the driving rod is mounted to the fixed block by a stationary shaft, a first end of the driving rod is connected with the crucible cover by transmission, the stationary shaft is perpendicular to the bearing face of the fixed block; and
a first end of the actuating lever is connected with the piston by transmission, and a second end of the actuating lever is pivotably connected with a second end of the driving rod by a pivot shaft, the actuating lever is configured to drive the driving rod to rotate about the stationary shaft.

15. The crucible device according to claim 3, wherein the crucible cover is slidable with respect to the fixed block by a sliding fit of at least one sliding slot and at least one sliding rail.

16. The crucible device according to claim 4, wherein the crucible cover is slidable with respect to a fixed block by a sliding fit of at least one sliding slot and at least one sliding rail.

17. The crucible device according to claim 5, wherein the crucible cover is slidable with respect to the fixed block by a sliding fit of at least one sliding slot and at least one sliding rail.

18. The crucible device according to claim 2, wherein when the crucible cover is in the closed state, a gas pressure in the closed chamber is one atmosphere.

19. The crucible device according to claim 3, wherein when the crucible cover is in the closed state, a gas pressure in the closed chamber is one atmosphere.

20. The crucible device according to claim 4, wherein when the crucible cover is in the closed state, a gas pressure in the closed chamber is one atmosphere.

* * * * *